United States Patent
Rapoport

(10) Patent No.: US 8,896,310 B2
(45) Date of Patent: Nov. 25, 2014

(54) CAGE IN AN MRD WITH A FASTENING/ATTENUATING SYSTEM

(75) Inventor: Uri Rapoport, Moshav Ben Shemen (IL)

(73) Assignee: Aspect Imaging Ltd., Shoham (IL)

( * ) Notice: Subject to any disclaimer, the term of this patent is extended or adjusted under 35 U.S.C. 154(b) by 434 days.

(21) Appl. No.: 13/338,633

(22) Filed: Dec. 28, 2011

(65) Prior Publication Data

US 2012/0124806 A1    May 24, 2012

Related U.S. Application Data

(62) Division of application No. 13/381,124, filed as application No. PCT/IL2010/000519 on Jun. 29, 2010.

(60) Provisional application No. 61/221,571, filed on Jun. 30, 2009.

(51) Int. Cl.
| | | |
|---|---|---|
| *G01V 3/00* | (2006.01) | |
| *G01R 33/383* | (2006.01) | |
| *G01R 33/38* | (2006.01) | |

(52) U.S. Cl.
CPC .......... *G01R 33/383* (2013.01); *G01R 33/3802* (2013.01)
USPC ............................ 324/319; 324/320; 335/302

(58) Field of Classification Search
USPC .......... 324/319, 320, 318, 300; 335/296, 297, 335/302, 306
See application file for complete search history.

(56) References Cited

U.S. PATENT DOCUMENTS

| | | | |
|---|---|---|---|
| 5,959,454 A | 9/1999 | Westphal et al. | |
| 6,191,584 B1 | 2/2001 | Trequattrini et al. | |
| 6,946,939 B2 | 9/2005 | Doi | |
| 7,400,147 B2* | 7/2008 | Rapoport | 324/318 |
| 7,529,575 B2* | 5/2009 | Rezzonico et al. | 600/410 |
| 7,551,954 B2* | 6/2009 | Green et al. | 600/415 |
| 2007/0068862 A1 | 3/2007 | Sisemore | |
| 2007/0096737 A1 | 5/2007 | Rapoport | |
| 2008/0246476 A1 | 10/2008 | Rapoport | |
| 2012/0119742 A1* | 5/2012 | Rapoport | 324/318 |

OTHER PUBLICATIONS

International Search Report and Written Opinion dated Nov. 9, 2010 in related International Application No. PCT/IL2010/000519.
International Preliminary Report on Patentability dated Sep. 28, 2011 in related International Application No. PCT/IL2010/000519.

* cited by examiner

*Primary Examiner* — Louis Arana
(74) *Attorney, Agent, or Firm* — The Law Office of Michael E. Kondoudis

(57) ABSTRACT

Methods of fastening a cage with a fastening system in an MRD. One method includes: assembling: a plurality of pole pieces; a plurality of side magnets, the side magnets substantially enclosing the pole pieces and thereby defining a magnetic envelope and enclosed volume therein; a plurality of side walls, the side walls substantially enclosing the side magnets; a plurality of face walls and a plurality of fastening rods; and passing a plurality of fastening rods through at least one of the side magnets and at least one of the pole pieces and fastening them in an effective measure, such that the rods physically interconnects at least one pair of side walls.

1 Claim, 13 Drawing Sheets

CAGE IN AN MRD WITH A FASTENING/ATTENUATING SYSTEM

REFERENCE TO RELATED APPLICATION

This application claims priority from U.S. Provisional Application No. 61/221,571, filed 30 Jun. 2009.

FIELD AND BACKGROUND OF THE INVENTION

The present invention pertains to a cage in a magnetic resonance device (MRD) with a fastening/attenuating system and methods thereof.

Magnetic resonance is used in a variety of applications to analyze and image matter, including nuclear magnetic resonance (NMR) spectroscopy, electron spin resonance (ESR) spectroscopy, nuclear quadrupole resonance (NQR), and magnetic resonance imaging (MRI). The principle is that when exposed to a uniform magnetic field, the subatomic particles in an atom will align with the magnetic field. A short electromagnetic burst disturbs the alignment, producing signals from the subatomic particles. The multitude of signals can tell an investigator about the composition, structure, and location of a sample. A more uniform magnetic field will produce less noise and more precise results. In order to produce a high quality image, the magnetic field used must be extremely stable and uniform.

The use of simple permanent magnet structures, such as C-magnet and H-magnet configurations, is not enough to achieve a sufficiently uniform magnetic field. In order to achieve such uniformity, elements correcting the inhomogeneity of the magnetic field are added, according to the principle of the fields' superposition. Coils, magnetic parts, or other means of enabling correction of the principal field are added in order to obtain a homogeneous field in the zone of interest. The precise location of these contributory components is crucial.

U.S. Pat. No. 5,959,454 to Westphal et. al. discloses a magnet arrangement for an NMR tomography system, in particular for skin and surface examinations, which contains a one-sided NMR system having two ring magnets and a cylindrical magnet. Their respective locations provide a certain degree of uniformity.

U.S. Pat. No. 6,191,584 presents a permanent magnet for NMR image detection which contains a magnetic structure having a yoke and magnetic poles, so shaped as to delimit or enclose a cavity.

U.S. Pat. No. 6,946,939 discloses a packaging plate for an interlocking magnetic circuit package comprised of multiple permanent magnets.

The ability to adjust the position and attenuation of contributory magnetic fields allows for a more precise calibration of the field in the area of interest. Therefore, a cage in a magnetic resonance device with a fastening and attenuating system still meets a long-felt need.

SUMMARY OF THE INVENTION

It is one object of the invention to disclose a cage with a fastening system in an MRD (magnetic resonance device), the cage with fastening system comprising a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; and, a plurality of P face walls, where P is an integer greater than or equal to 2; and a plurality of fastening rods; wherein each of the fastening rods physically interconnects at least one pair of side walls, passing through at least one of the side magnets and at least one of the pole pieces.

It is another object of the invention to disclose a cage in a magnetic resonance device; it is characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; and a plurality of fastening screws; wherein each of the fastening screws physically interconnects one of the face walls with one of the side walls.

It is another object of the invention to disclose a cage in a magnetic resonance device; it is characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; a plurality of fastening rods; and, a plurality of fastening screws; wherein each of the fastening rods physically interconnects at least one pair of side walls, passing through at least one of the side magnets and at least one of the pole pieces, and further wherein each of the fastening screws physically interconnects one of the face walls with one of the side walls.

It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls defined by at least one shaped recess, the side walls substantially enclosing the side magnets; a plurality of P face walls defined by at least one anchoring latches suitable to be securely accommodated within the shaped recess, where P is an integer greater than or equal to 2; and a plurality of fastening screws; wherein each of the anchoring latches physically interconnects one of the face walls with one of the side walls.

It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; optionally, a set of two or more fastening abutments; and at least one fastening belt, optionally fastened and secured by means of ratchet; wherein the fastening belt physically interconnects at least a portion of the circumference of the cage.

It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; a plurality of fastening rods; optionally, a set of two or more fastening abutments; and at least one fastening belt, optionally fastened and secured by means of ratchet; wherein each of the fastening rods physically interconnects at least one pair of side walls, passing through at least one of the side magnets and at least one of the pole pieces; and further wherein the fastening belt physically interconnects at least a portion of the circumference of the cage It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; a plurality of fastening screws; optionally, a set of two or more fastening abutments; and at least one fastening belt, optionally fastened and secured by means of ratchet; wherein each of the fastening screws physically interconnects one of the face walls with one of the side walls; and further wherein each of the fastening belt physically interconnects at least a portion of the circumference of the cage.

It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls, the side walls substantially enclosing the side magnets; a plurality of P face walls, where P is an integer greater than or equal to 2; a plurality of fastening rods; a plurality of fastening screws; optionally, a set of two or more fastening abutments; and at least one fastening belt, optionally fastened and secured by means of ratchet; wherein each of the fastening rods physically interconnects at least one pair of side walls, passing through at least one of the side magnets and at least one of the pole pieces; wherein each of the fastening screws physically interconnects one of the face walls with one of the side walls; and further wherein each of the fastening belt physically interconnects at least a portion of the circumference of the cage.

It is another object of the invention to disclose a cage in a magnetic resonance device, characterized in that the cage is secured by a fastening system, and comprises a plurality of M pole pieces, where M is an integer greater than or equal to 2; a plurality of N side magnets, where N is an integer greater than or equal to 2, the side magnets substantially enclosing the pole pieces and thereby defining a magnetic envelope and enclosed volume therein; a plurality of N side walls defined by at least one shaped recess, the side walls substantially enclosing the side magnets; a plurality of P face walls defined by at least one anchoring latches suitable to be securely accommodated within the shaped recess, where P is an integer greater than or equal to 2; optionally, a set of two or more fastening abutments; and at least one fastening belt, optionally fastened and secured by means of ratchet; wherein the fastening belt physically interconnects at least a portion of the circumference of the cage; and further wherein each of the anchoring latches physically interconnects one of the face walls with one of the side walls.

It is another object of the invention to disclose a cage in a magnetic resonance device, characterized by shaped internal and/or external cross-section; the shape is selected from a group consisting of polygon having three or more facets, cylinder and any combination thereof.

It is another object of the invention to disclose a cage in a magnetic resonance device, wherein the fastening means are configured in a manner it characterized by shaped cross-section; the shape is selected from a group consisting of polygon having three or more facets, cylinder and any combination thereof.

It is another object of the invention to disclose a cage with a fastening/attenuating system in an MRD and comprises a plurality of M pole pieces, where M is an integer greater than or equal to 2; and a plurality of Q main magnets, where Q is an integer greater than or equal to 2, at least one of the main magnets is attached to at least one pole piece; the main magnet and/or the pole piece positioned, when cage is assembled, in a three-dimensional configuration ensuring application of highest homogeneous magnetic gradient by the magnets; a plurality of N side magnets, where N is an integer greater than or equal to 2, the side magnets substantially enclosing the pole pieces and thereby defining a magnetic envelope and enclosed volume therein; a plurality of N side walls defined by at least one shaped recess, the side walls substantially enclosing the side magnets; a plurality of P face walls, where P is an integer greater than or equal to 2; a plurality of R separating/adjusting rods (SAPs), where R is an integer greater than or equal to 1, each of said SAPs oriented substantially north-south relative to the poles of said main magnets and crossing the end cover, the end cup, potentially a preset gap between the end cover and the end gap, the main magnet and the pole piece, with at least one of said SAPs being fastenable, maneuverable or otherwise adjustable by means of a controlled adjusting mechanism located adjacent to at least one end of said SAP; wherein by fastening, maneuvering or otherwise adjusting said SAP by means of the controlled adjusting mechanism, the three-dimensional configuration of the either main magnet and/or pole piece is adjusted providing a homogeneous, stable and uniform magnetic field therein.

It is another object of the invention to disclose a cage with a fastening/attenuating system in an MRD as defined above, characterized by a shaped internal and/or external cross-section; the shape is selected from a group consisting of polygon having three or more facets, cylinder and any combination thereof.

It is another object of the invention to disclose a cage with a fastening/attenuating system in an MRD as defined above, characterized by a a shaped cross-section; the shape is selected from a group consisting of polygon having three or more facets, cylinder and any combination thereof.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of face walls and a plurality of fastening rods; and (b) passing a plurality of fastening rods through at least one of the side magnets and at least one of the pole pieces and fastening them in an effective measure, such that the rods physically interconnects at least one pair of side walls.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of face walls; and, a plurality of fastening screws; and (b) physically interconnecting one of the face walls the fastening screws with one of the side walls.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of face walls; and a plurality of fastening rods; and plurality of fastening screws; and (b) passing a plurality of fastening rods through at least one of the side magnets and at least one of the pole pieces and fastening them in an effective measure, such that the rods physically interconnects at least one pair of side walls; while physically interconnecting one of the face walls the fastening screws with one of the side walls.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of P face walls defined by at least one anchoring latches suitable to be securely accommodated within the shaped recess; and, a plurality of fastening screws; and (b) physically interconnecting one of the face walls' anchoring latches with one of the side walls.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of face walls; and at least one fastening belt, optionally fastened and secured by means of ratchet; and (b) physically interconnecting at least a portion of the circumference of the cage by the fastening belt.

It is another object of the invention to disclose a method of fastening a cage with a fastening system in an MRD, said method comprising steps of (a) assembling a plurality of pole pieces, a plurality of side magnets, the side magnets substantially enclosing the pole pieces and thereby defining a magnetic envelope and enclosed volume therein; a plurality of side walls, the side walls substantially enclosing the side magnets; a plurality of face walls; at least one fastening belt, optionally fastened and secured by means of ratchet; and a plurality of fastening rods; and (b) passing a plurality of the fastening rods through at least one of the side magnets and at least one of the pole pieces and fastening them in an effective measure, such that the rods physically interconnects at least one pair of side walls while physically interconnecting at least a portion of the circumference of the cage by the fastening belt.

It is another object of the invention to disclose a method of attenuating the magnetic field within a sample cavity in a fastened cage of an MRD, the method comprising steps of (a) assembling a plurality of pole pieces; a plurality of main magnets; at least one of the main magnets is attached to at least one pole piece, the main magnet and/or the pole piece positioned, when cage is assembled, in a three-dimensional configuration ensuring application of highest homogeneous magnetic gradient by the magnets; a plurality of side magnets, the side magnets substantially enclosing the pole pieces and thereby defining a magnetic envelope and enclosed volume therein; a plurality of side walls defined by at least one shaped recess, the side walls substantially enclosing the side magnets; a plurality of face walls; a plurality of R separating/adjusting rods (SAPs), where R is an integer greater than or equal to 1, each of the SAPs oriented substantially north-south relative to said main magnets and crossing the end cover, the end cup, potentially a preset gap between the end cover and the end gap, the main magnet and the pole piece, and (b) fastening, maneuvering or otherwise adjusting at least one of said SAPs by means of a controlled adjusting mechanism located adjacent to at least one end of the SAP; such that the three-dimensional configuration of the either main magnet and/or pole piece is adjusted providing a homogeneous, stable and uniform magnetic field therein.

BRIEF DESCRIPTION OF THE FIGURES

In order to understand the invention and to see how it may be implemented in practice, a plurality of embodiments is adapted to now be described, by way of non-limiting example only, with reference to the accompanying drawings, in which FIG. 1A and FIG. 1B each illustrates a schematic top view of an alternative integratably-fastened and mechanically secured cage in an MRD with a fastening system (rod-based systems 1A and 1B) according to one embodiment of the invention;

FIG. 12*a* is a top view, and FIG. 12*b* is top view of the same, along cut A:A.

DETAILED DESCRIPTION OF PREFERRED EMBODIMENTS OF THE INVENTION

Figure 1A:
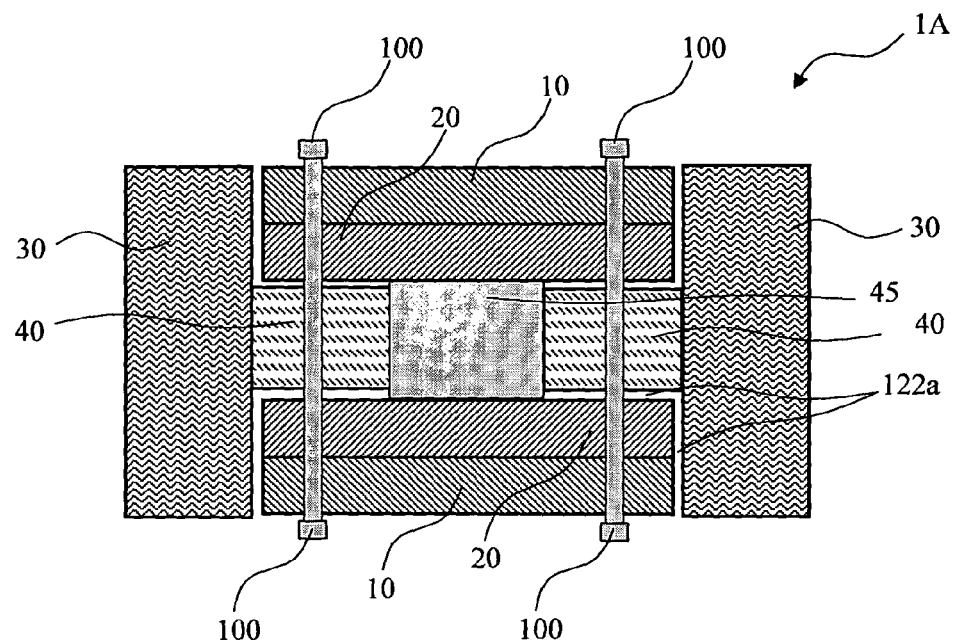

The following description is provided so as to enable any person skilled in the art to make use of the invention and sets forth the best modes contemplated by the inventor of carrying out this invention. Various modifications, however, will remain apparent to those skilled in the art, since the general principles of the present invention have been defined specifically to provide a cage in an MRD with a fastening/attenuating system and methods thereof. Therefore, the invention is not limited by that which is illustrated in the figures and described in the specification, but only as indicated in the accompanying claims, with the proper scope determined only by the broadest interpretation of said claims.

The term 'magnetic resonance device' (MRD) applies hereinafter to any Magnetic Resonance Imaging (MRI) device, any Nuclear Magnetic Resonance (NMR) spectroscope, any Electron Spin Resonance (ESR) spectroscope, any Nuclear Quadrupole Resonance (NQR) or any combination thereof.

The term 'tolerance' refers hereinafter to the interval between the corner-magnets and the cage walls, enabling displacement of the walls.

The term 'about' refers hereinafter to ±20% of the defined measure. The term 'plurality' if not otherwise specified, applies hereinafter to any integer greater than or equal to one.

The term 'adjust' applies hereinafter to a change of the magnet's parameters before or after assembly, to optimize the magnetic field uniformity.

The term 'pole-piece' applies hereinafter to an element of high permeability material used to shape the uniformity of the magnetic flux from a permanent magnet. It is in the scope of the present invention wherein the pole-magnet pieces are selected from metal alloying material, and especially from steel material.

It is in the scope of the invention wherein the term pole-piece also refers to attenuable or otherwise adjustable pole pieces, adapted to ensure a homogeneous, stable and uniform magnetic field within the diagnostic zone, interchangeably descried below as a confined volume, sample cavity etc. Hence for example, toroidal and disk-shaped rings, cubes or any other constructions can be incorporated adjacent to or within pole pieces, and extruded from ferromagnetic metals, non-ferromagnetic metals, non-metallic substances or magnetic materials.

According to an embodiment of the invention which is presented in a non-limiting manner, a steel pole piece, formed as a right solid cylindrical section approximately equal in diameter to the main magnet, is positioned in face-to-face with main magnet and main magnet face. The entire assembly is positioned within a right cylindrical or polygonal steel sleeve or cage which is closed off by a cylindrical or polygonal steel end cap. A second permanent magnet assembly is placed within the sleeve or cage in face-to-face relationship with an identical, mirror image permanent magnet assembly having substantially identical components and construction and spaced apart from the second magnet assembly to form an air gap therebetween. A steel sleeve extends to enclose the magnet assemblies and the air gap. A pair of removable side walls allows access to the air gap when removed from sleeve or cage. Permanent magnet assemblies opposite in polarity create a magnetic flux field across the air gap. A centrally located segment of the air gap is identified as a diagnostic zone across which the magnetic flux is at its most powerful and uniform.

The term 'side-magnets' applies hereinafter to permanent magnets arranged around the sides of pole-pieces. It is in the scope of the invention wherein at least a portion of side-magnets are superconductors or ferromagnets.

Figure 1B:
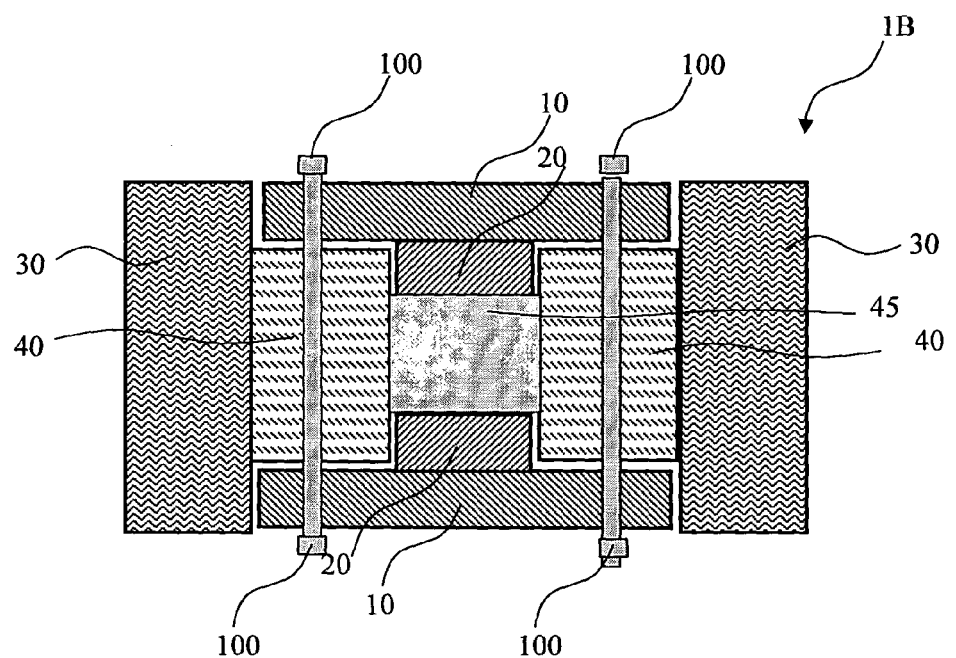

It is thus one embodiment of the present invention to provide an efficient cage of an MRD for providing a homogeneous, stable and uniform magnetic field therein, characterized by an outside shell. A fastening system, integrated within the cage, is disclosed and shown in alternative configurations (1A and 1B) in FIG. 1*a* and FIG. 1*b*. Both configurations 1A and 1B, as well as cages 2-11 defined below, are illustrated schematically (not to scale). The cage with fastening system (1) comprises a plurality of M pole pieces (45), where M is an integer greater than or equal to 2; a plurality of N side magnets (20), where N is an integer greater than or equal to 2, the side magnets substantially enclosing the pole pieces and thereby defining a magnetic envelope and enclosed volume therein; a plurality of N side walls (10), the side walls substantially enclosing the side magnets; and, a plurality of P face walls (30), where P is an integer greater than or equal to 2, and a plurality of fastening rods (100). Each of the fastening rods physically interconnects at least one pair of side walls, passing through at least one of the side magnets and at least one of the pole pieces (45). It is in the scope of the invention wherein at least a portion of the walls are made of metal alloys, preferably soft iron alloy. It is also in the scope of the present invention wherein the cage's general contour is characterized by (i) a polyhedron such as tetrahedron, pentahedron or hexahedron; rounded, curved or circular cross section or any combination thereof.

Rods (100) are at least partially made of materials selected in a non-limiting manner from a group consisting of metals, especially stainless steel, polymers, composite materials and mixtures thereof. It is in the scope of the invention wherein the rods are an elongated members characterized by a shaped cross-section, the shape is selected in a non-limiting manner form a group consisting of rectangular, polygonal, rounded, twisted round, curved, having a crescent form, recess, niche, bores or notches, screws and a combination thereof.

It is still in the scope of the present invention wherein at least one of the cage's walls is interconnected with an adjacent wall via a lip-containing connection defining a tolerance enabling the cage's wall to displace, and to prevent leakage of the cage's magnetic field.

Figure 2:
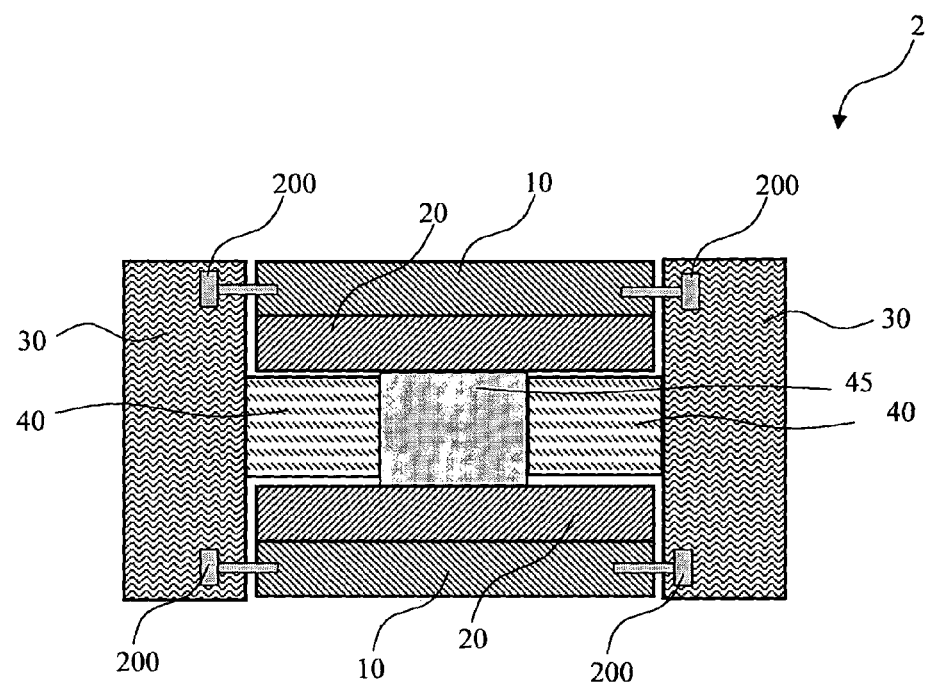
FIG. 2 is a schematic top view of another integratably-fastened and mechanically secured cage in an MRD with a fastening system (a screw-based system 2) according to another embodiment of the invention.

According to another embodiment of the invention, A cage with a fastening system in an MRD is disclosed and shown in FIG. 2. The cage with fastening system (2) comprises a plurality of M pole pieces (45), where M is an integer greater than or equal to 2; a plurality of N side magnets, where N is an integer greater than or equal to 2, the side magnets substantially enclosing the pole pieces (45), and thereby defining a magnetic envelope and enclosed volume therein; a plurality of N side walls (10), the side walls substantially enclosing the side magnets; a plurality of P face walls (30), where P is an integer greater than or equal to 2; and a plurality of fastening screws (200). Each of the fastening screws physically interconnects one of the face walls with one of the side walls.

Figure 3:
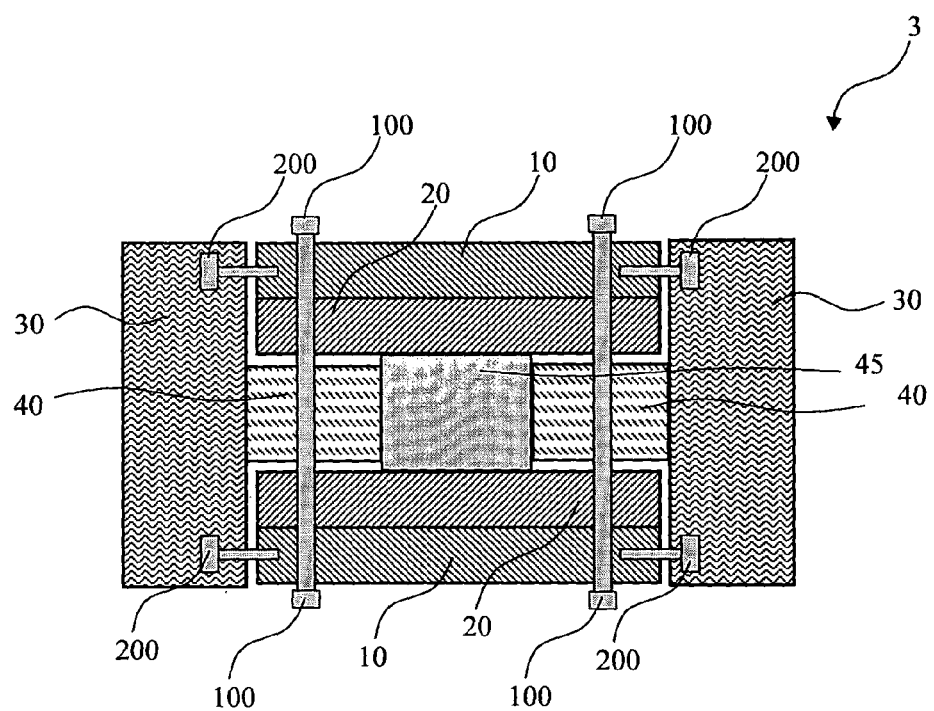
FIG. 3 and FIG. 4 illustrate each a schematic top view of another integratably-fastened and mechanically secured cage in an MRD with a fastening system (both rod & screw-based system 3, 4) according to another embodiment of the invention.

According to another embodiment of the invention, A cage with a fastening system in an MRD is disclosed and shown in FIG. 3. The cage with fastening system (3) comprises a plurality of M pole pieces (45), where M is an integer greater than or equal to 2; a plurality of N side magnets, where N is an integer greater than or equal to 2, the side magnets substantially enclosing the pole pieces (45), and thereby defining a magnetic envelope and enclosed volume therein; a plurality of N side walls (10), the side walls substantially enclosing the side magnets; a plurality of P face walls (30), where P is an integer greater than or equal to 2; a plurality of fastening rods (100); and a plurality of fastening screws (200). Each of the fastening rods physically interconnects at least one pair of side walls, passing through at least one of the side magnets and at least one of the pole pieces (45), and further wherein each of the fastening screws physically interconnects one of the face walls with one of the side walls.

Figure 4:
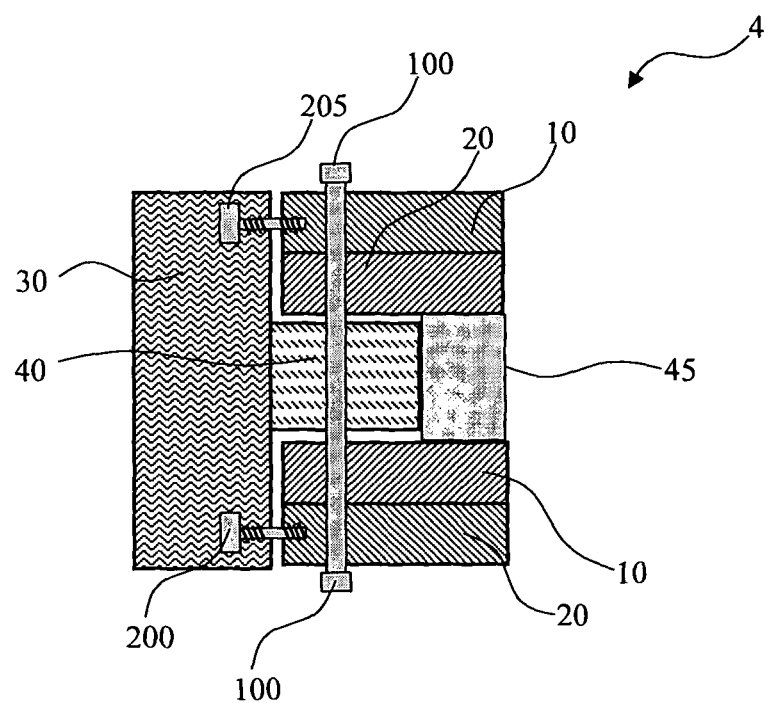

According to another embodiment of the invention, A cage with a fastening system in an MRD is disclosed and shown in FIG. 4. The cage with fastening system (4) comprises a plurality of M pole pieces (45), where M is an integer greater than or equal to 2; a plurality of N side magnets, where N is an integer greater than or equal to 2, the side magnets substantially enclosing the pole pieces (45), thereby defining a magnetic envelope and enclosed volume therein; a plurality of N side walls (10) defined by at least one shaped recess, the side walls substantially enclosing the side magnets; a plurality of P face walls (30) defined by at least one anchoring latches (210) suitable to be securely accommodated within the shaped recess, where P is an integer greater than or equal to 2; and a plurality of fastening screws (200). Each of the anchoring latches physically interconnects one of the face walls with one of the side walls.

Figure 5:
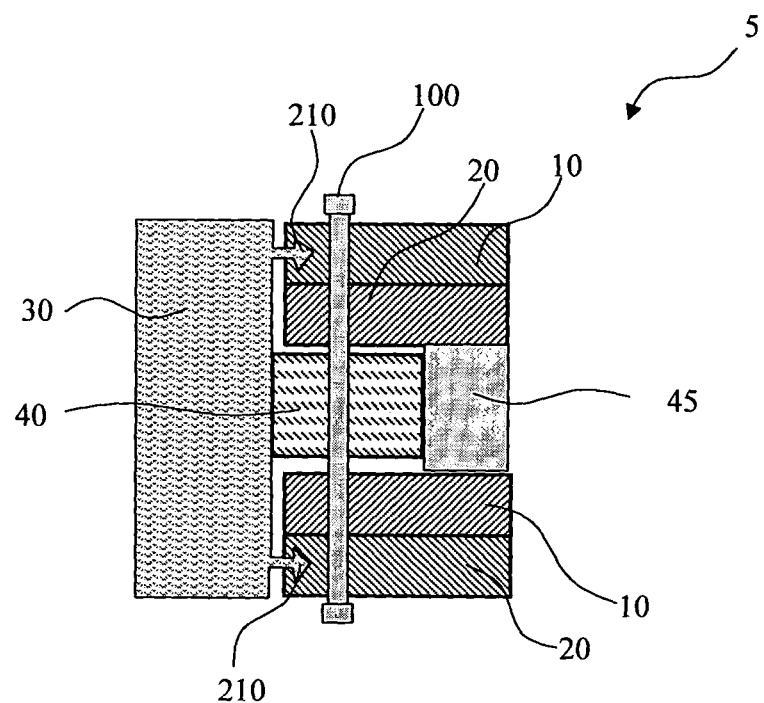
FIG. 5 illustrates a schematic side top of another integratably-fastened and mechanically secured cage in an MRD with a fastening system (both rod & latch-based system 5) according to another embodiment of the invention.

According to another embodiment of the invention, A cage with a fastening system in an MRD is disclosed and shown in FIG. 5. The cage with fastening system (5) comprises a plurality of M pole pieces (45), where M is an integer greater than or equal to 2; a plurality of N side magnets, where N is an integer greater than or equal to 2, the side magnets substantially enclosing the pole pieces (45), thereby defining a magnetic envelope and enclosed volume therein; a plurality of N side walls (10) defined by at least one shaped recess, the side walls substantially enclosing the side magnets; a plurality of P face walls (30) defined by at least one screw (205) suitable to be securely accommodated within the shaped recess, where P is an integer greater than or equal to 2; and a plurality of fastening screws (200). Each of the anchoring latches physically interconnects one of the face walls with one of the side walls.

Figure 6:
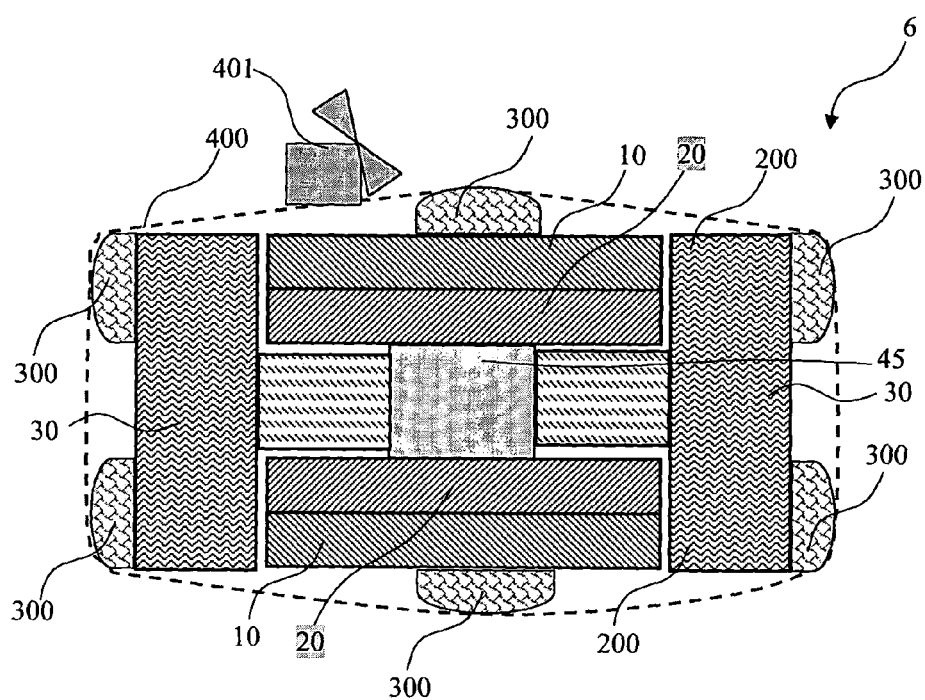
FIG. 6 illustrates a side schematic top of another non-integrated-fastened and mechanically secured cage in an MRD with a fastening system (a cable-based system 6) according to another embodiment of the invention.

According to another embodiment of the invention, A cage with a fastening system in an MRD is disclosed and shown in FIG. 6. The cage with fastening system (6) comprises a plurality of M pole pieces (45), where M is an integer greater than or equal to 2; a plurality of N side magnets, where N is an integer greater than or equal to 2, the side magnets substantially enclosing the pole pieces (45), and thereby defining a magnetic envelope and enclosed volume therein; a plurality of N side walls (10), the side walls substantially enclosing the side magnets; a plurality of P face walls (30), where P is an integer greater than or equal to 2; optionally, a set of two or more fastening abutments (300); and, at least one fastening belt (400), optionally fastened and secured by means of ratchet 401. The fastening belt physically interconnects at least a portion of the circumference of the cage.

Figure 7:
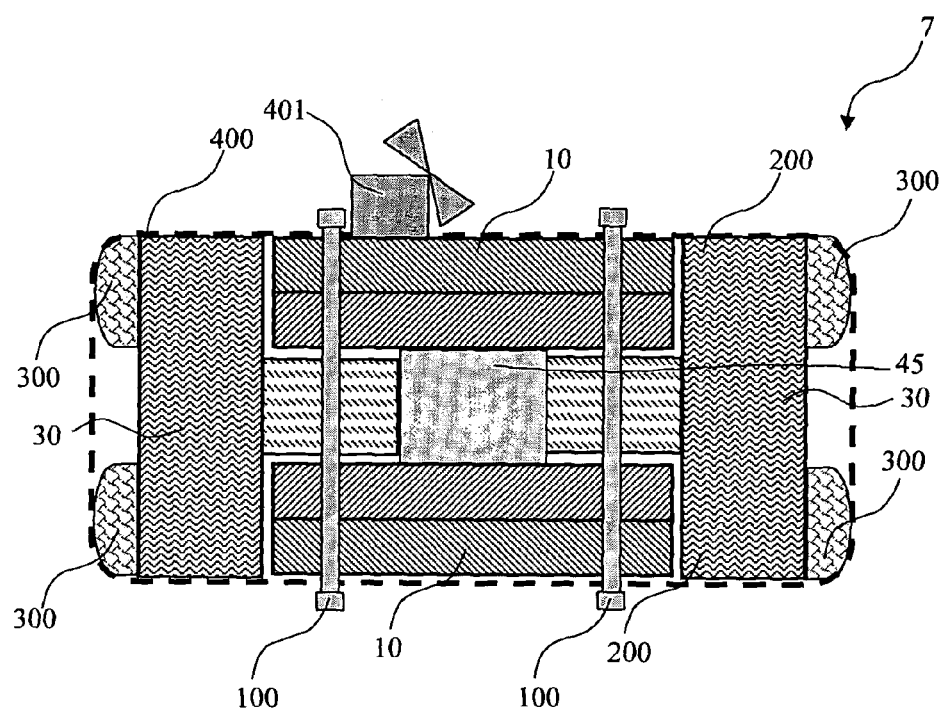
FIG. 7 illustrates a schematic top of both non-integrated and integratably-fastened mechanically secured cage in an MRD with a fastening system (both rod & cable-based system 7) according to another embodiment of the invention.

According to another embodiment of the invention, A cage with a fastening system in an MRD is disclosed and shown in FIG. 7. The cage with fastening system (7) comprises a plurality of M pole pieces (45), where M is an integer greater than or equal to 2; a plurality of N side magnets, where N is an integer greater than or equal to 2, the side magnets substantially enclosing the pole pieces (45), and thereby defining a magnetic envelope and enclosed volume therein; a plurality of N side walls (10), the side walls substantially enclosing the side magnets; a plurality of P face walls (30), where P is an integer greater than or equal to 2; a plurality of fastening rods (100); optionally, a set of two or more fastening abutments (300); and at least one fastening belt (400), optionally fastened and secured by means of ratchet 401. Each of the fastening rods physically interconnects at least one pair of side walls, passing through at least one of the side magnets and at least one of the pole pieces (45); and further wherein the fastening belt physically interconnects at least a portion of the circumference of the cage.

Figure 8:
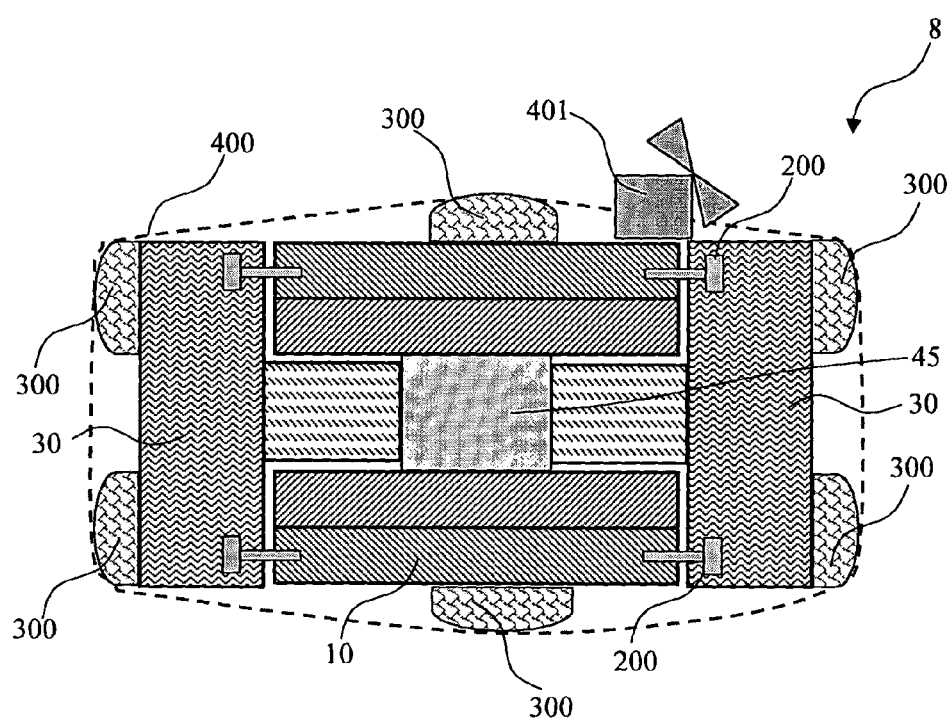
FIG. 8-10 illustrate each a schematic top view of both non-integrated and integratably-fastened mechanically secured cage in an MRD with a fastening system (both latch or screw & cable-based systems 8-10) according to another embodiment of the invention.

According to another embodiment of the invention, A cage with a fastening system in an MRD is disclosed and shown in FIG. 8. The cage with fastening system (8) comprises a plurality of M pole pieces (45), where M is an integer greater than or equal to 2; a plurality of N side magnets, where N is an integer greater than or equal to 2, the side magnets substantially enclosing the pole pieces (45), thereby defining a magnetic envelope and enclosed volume therein; a plurality of N side walls (10), the side walls substantially enclosing the side magnets; a plurality of P face walls (30), where P is an integer greater than or equal to 2; a plurality of fastening screws (200); optionally, a set of two or more fastening abutments (300); and at least one fastening belt (400), optionally fastened and secured by means of ratchet 401. Each of the fastening screws physically interconnects one of the face walls with one of the walls; and further wherein each fastening belt physically interconnects at least a portion of the circumference of the cage.

Figure 9:
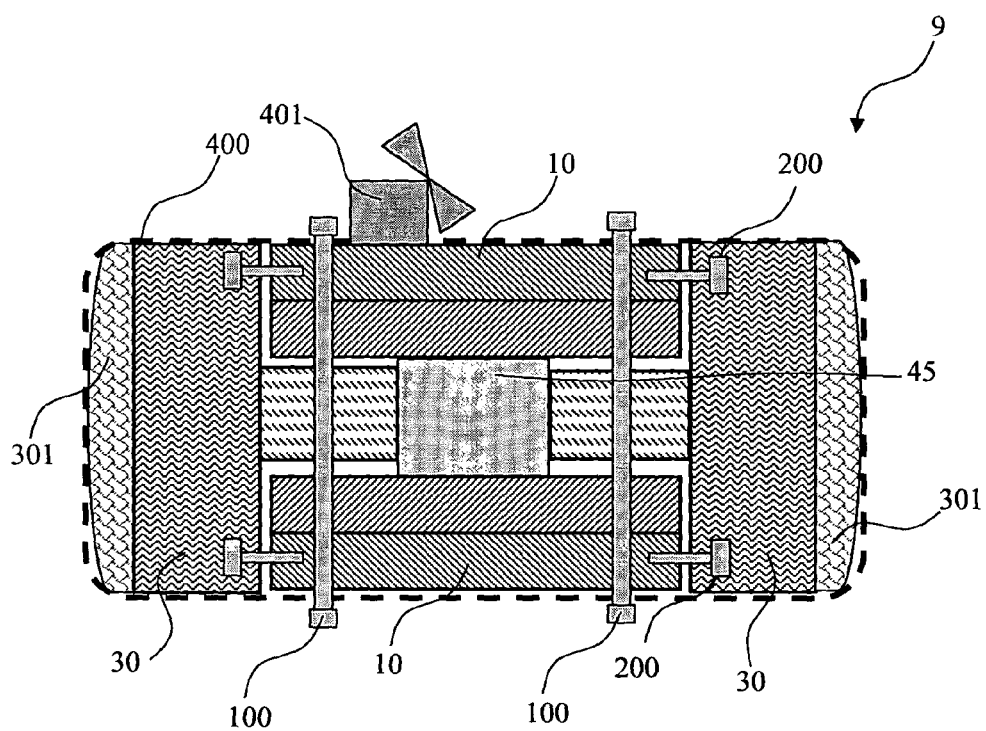

According to another embodiment of the invention, A cage with a fastening system in an MRD is disclosed and shown in FIG. 9. The cage with fastening system (9) comprises a plurality of M pole pieces (45), where M is an integer greater than or equal to 2; a plurality of N side magnets, where N is an, integer greater than or equal to 2, the side magnets substantially enclosing the pole pieces (45), thereby defining a magnetic envelope and enclosed volume therein; a plurality of N side walls (10), the side walls substantially enclosing the side magnets; a plurality of P face walls (30), where P is an integer greater than or equal to 2; a plurality of fastening rods (100); a plurality of fastening screws (200); optionally, a set of two or more fastening abutments (300); and at least one fastening belt (400), optionally fastened and secured by means of ratchet 401. Each of the fastening rods physically interconnects at least one pair of side walls, passing through at least one of the side magnets and at least one of the pole pieces (45); wherein each of the fastening screws physically interconnects one of the face walls with one of the side walls; and further wherein each of the fastening belt physically interconnects at least a portion of the circumference of the cage.

Figure 10:
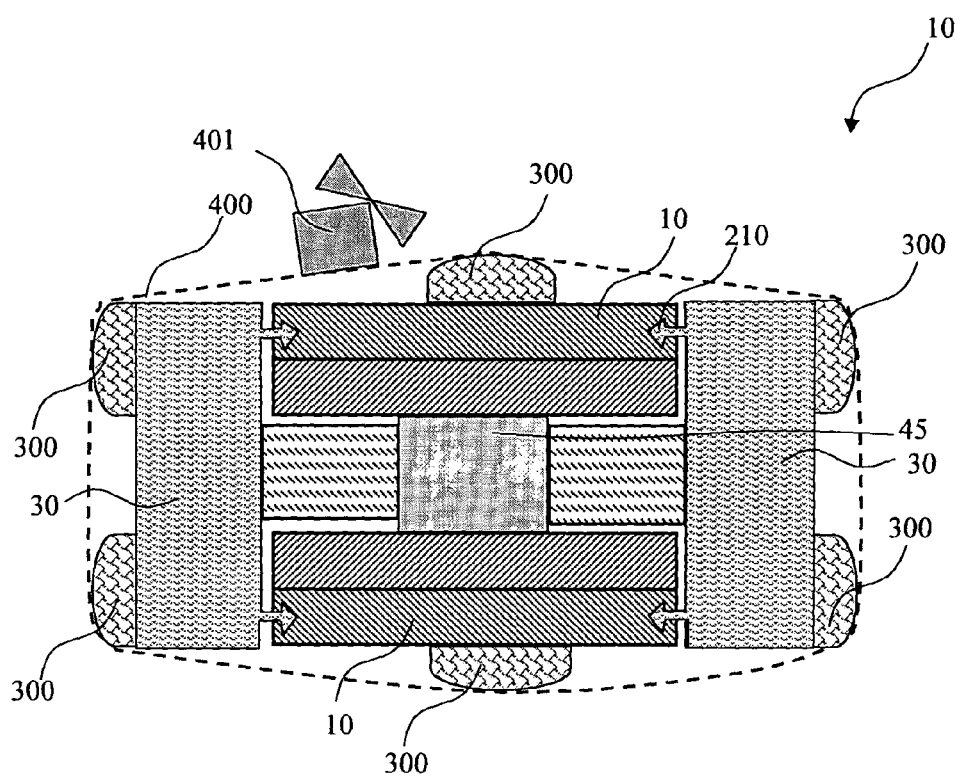

According to another embodiment of the invention, A cage with a fastening system in an MRD is disclosed and shown in FIG. 10. The cage with fastening system (10) comprises a plurality of M pole pieces (45), where M is an integer greater than or equal to 2; a plurality of N side magnets (20), where N is an integer greater than or equal to 2, the side magnets substantially enclosing the pole pieces (45), thereby defining a magnetic envelope and enclosed volume therein; a plurality of N side walls (10) defined by at least one shaped recess, the side walls substantially enclosing the side magnets; a plurality of P face walls (30) defined by at least one anchoring latches (210) suitable to be securely accommodated within the shaped recess, where P is an integer greater than or equal to 2; optionally, a set of two or more fastening abutments (300); and at least one fastening belt (400), optionally fastened and secured by means of ratchet 401. The fastening belt physically interconnects at least a portion of the circumference of the cage; and further wherein each of the anchoring latches physically interconnects one of the face walls with one of the side walls.

Fastening belt (400) is at least partially made of materials selected in a non-limiting manner from a group consisting of metals, especially stainless steal, polymers, composite materials and mixtures thereof. The fastening belt is constructed from flexible or non flexible materials. The belt may be narrow or wide. A net comprising a plurality of belts, e.g., some of them incorporated within others, is a useful option.

Figure 11:
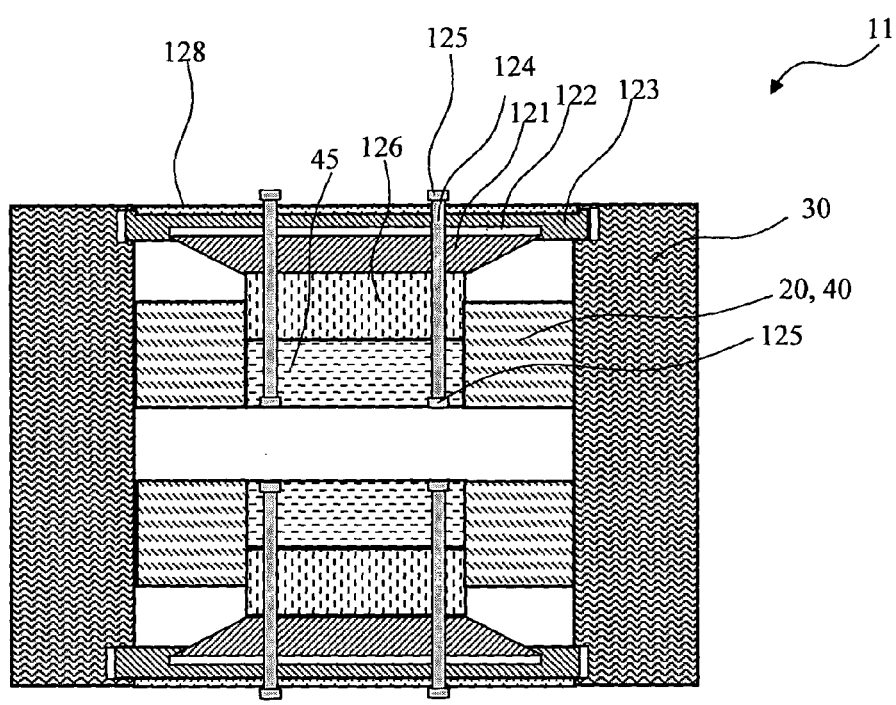
FIG. 11 illustrates a schematic side view of an attenuable cage in an MRD with a attenuating/fastening system (SAPS-based system 11) according to another embodiment of the invention, useful for providing a homogeneous, stable and uniform magnetic field in sample cavity confined by the cage, within which a sample is introduced.

According to another embodiment of the invention, a cage in an MRD with a fastening/attenuating system (11) is disclosed and shown in FIG. 11 (side view) comprises a plurality of M side magnets (40), where M is an integer greater than or equal to 2; and a plurality of Q main magnets (126), where Q is an integer greater than or equal to 2, at least one of the main magnets being attached to at least one pole piece (45); the main magnet and/or the pole piece positioned, when the cage is assembled, in a three-dimensional configuration ensuring application of the highest homogeneous magnetic gradient by the magnets; a plurality of N side magnets (20), where N is an integer greater than or equal to 2, the side magnets substantially enclosing the pole pieces (45), and thereby defining a magnetic envelope and enclosed volume therein; a plurality of N side walls (10) defined by at least one shaped recess, the side walls substantially enclosing the side magnets; a plurality of P face walls (30), where P is an integer greater than or equal to 2; optionally at least one anchoring latch (210), suitable to be securely accommodated within the shaped recess is provided; R separating/adjusting rods (SAPs, 124) (here, screw rods), where R is greater than or equal to 1; each of the SAPs crosses the end; side view pole, piece (45), cover (123), optionally an external wall (128), an end cup (121), potentially a preset gap between the end cover and the end gap (122), the main magnet (126) and the pole piece (45); at least one of the SAPs is fastenable, maneuverable or otherwise adjustable by means of a controlled attenuating mechanism (125), e.g., a screw-nut etc., located adjacent to at least one end of the SAP. By fastening, maneuvering or otherwise adjusting the SAP by means of the controlled attenuating mechanism, the three-dimensional configuration of the either main magnet and/or pole pieces (45), is adjusted, providing both (i) a homogeneous, stable and uniform magnetic field therein and (ii) a relatively large sample cavity confined by the cage, within which a sample is introduced.

It is also in the scope of the invention wherein a set of two or more fastening abutments (300) and/or at least one fastening belt (400) physically interconnects at least a portion of the circumference of the cage. Also in the scope of the invention is a cage in an MRD with a fastening/attenuating system (11) with at least one anchoring latch suitable to be securely accommodated within a shaped recess as defined above.

Figure 12A:
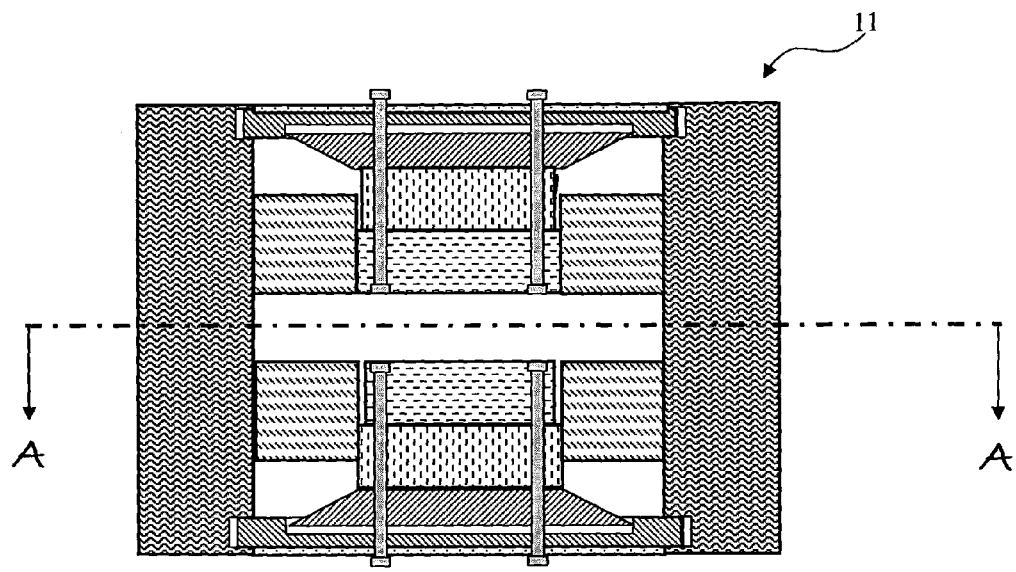
FIGS. 12*a* and 12*b* illustrate each a schematic side view of an attenuable cage in an MRD with a attenuating/fastening system (SAPs-based system 11) as defined above.
Figure 12B:
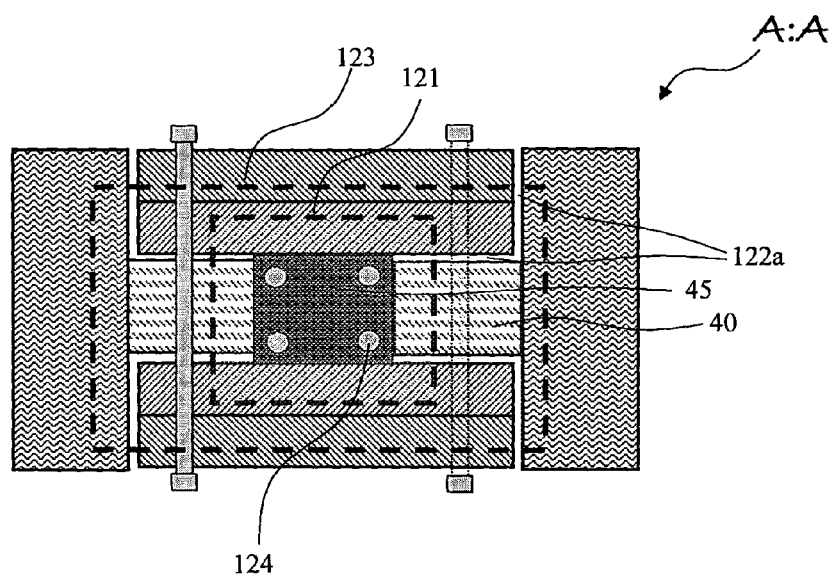
Figure 13:
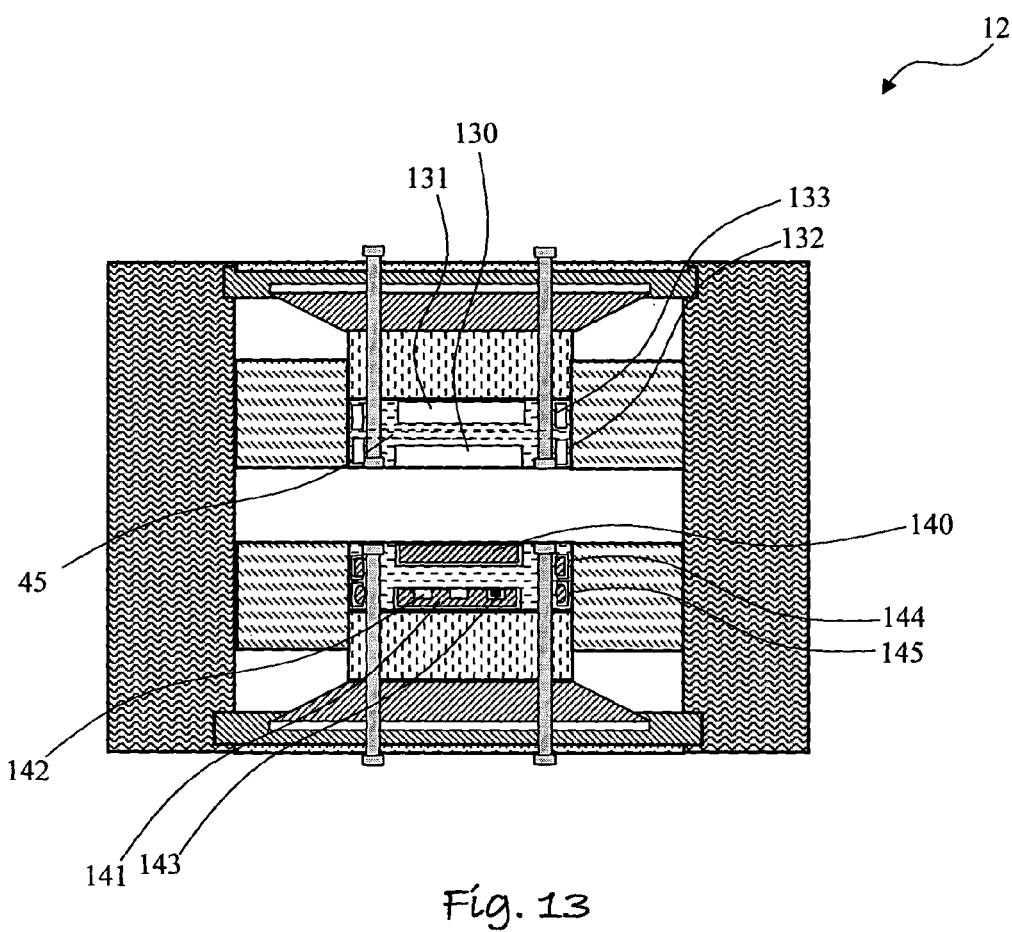
FIG. 13 illustrates a schematic side view of an attenuable cage in an MRD with a different attenuating/fastening system (SAPs-based system 12) according to another embodiment of the invention, useful for providing a homogeneous, stable and uniform magnetic field in sample cavity confined by the cage, within which a sample is introduced.

Reference is now made to FIGS. 12a and 12b, presenting the cage in an MRD with a fastening/attenuating system (11) as defined above. Cross section A:A illustrated in FIG. 12a (side view) is further schematically presented in FIG. 12b in a not-to-scale cross-section (top view), and comprises end cover (dashed line 123), end cup (dashed line 121), SAPs (124), side magnets (40) and pole piece (45). Side magnets 40 are preferably positioned within narrow air gaps 122a.

According to another embodiment of the invention, a cage in an MRD with a fastening/attenuating system (12) is disclosed and shown in FIG. 12 (side view). The device shown in FIG. 12 is similar to the one disclosed and defined in FIG. 11, except for a few changes: e.g., pole piece 45 further comprises one or more recesses (cavities, grooves, channels, conduits, bores etc) adapted to accommodate attenuation means. The attenuation means are members utilized for adjusting the magnetic flux created by the initial MRD/cage magnet arrangement. The attenuation means may include a plurality of bolts rotatably journaled to each shim, each bolt being individually axially adjustable with respect to a pole piece whereby each shim may be positioned in a direction in to or outward from each cavity and whereby each shim may be positioned at a tilt with respect to pole piece axis. Additionally or alternatively, toroidal rings or ring-like structures having rectangular or other cross-section may be used.

Hence for example, recess 130 is a disk groove adapted to place disk 140. The disk, located in a recess positioned adjacent to the measuring volume (130), and/or in an opposite location (131), is either made of continuous and homogeneous/heterogeneous composition (see 140 for example), or otherwise provided with one or more bores (See 142) adapted to contain one or more attenuating means (143) of various shapes, sizes and compositions. Additionally or alternatively, pole piece 45 comprises one or more lateral recesses, such as a groove positioned adjacent to the measuring volume (132), and/or a groove located in the opposite direction (133). Grooves 132 and/or 133 adapted to contain rings of any size, shape and composition, such as rectangular (polygonal) cross-section (144), cylindrical or ellipsoidal cross-section (145), etc.

By fastening, maneuvering or otherwise adjusting the SAP by means of the controlled attenuating mechanism, the three-dimensional configuration of the main magnet and/or pole piece is adjusted, providing both (i) a homogeneous, stable and uniform magnetic field therein and (ii) a relatively large sample cavity confined by the cage, within which a sample is introduced.

In another embodiment of the present invention a method of obtaining an integratably fastened cage is disclosed, comprising a step of incorporating at least one internal (integrated) fastening means as defined above, e.g., fastening rods, fastening screws, anchoring latches etc.

In another embodiment of the present invention a method of obtaining a non-integrated fastened cage is disclosed, comprising a step of incorporating at least one external (non-integrated) fastening means as defined above, e.g., a fastening belt.

In another embodiment of the present invention a method of obtaining an integratably sensitively-attenutated cage of an MRD is disclosed. The method comprises steps of (a) providing an MRD as defined above; (b) incorporating a plurality of SAPs within the cage, and optionally further incorporating either or both (i) at least one internal (integrated) attenuating means as defined above, e.g., fastening rods, fastening screws, anchoring latches etc., and (ii) at least one external (non-integrated) fastening means as defined above, e.g., a fastening belt; and (c) fastening, maneuvering or otherwise adjusting the SAP or SAPs by means of a controlled-attenuating mechanism thus providing a homogeneous, stable and uniform magnetic field in sample cavity confined by the cage, within which a sample is introduced.

The invention claimed is:

1. A method of fastening a cage with a fastening system in an MRD, said method comprising steps of:
   a. assembling a plurality of pole pieces; a plurality of side magnets, said side magnets substantially enclosing said pole pieces and thereby defining a magnetic envelope and enclosed volume therein; a plurality of side walls, said side walls substantially enclosing said side magnets; a plurality of face walls and a plurality of fastening rods; and,
   b. passing a plurality of fastening rods through at least one of said side magnets and at least one of said pole pieces and fastening them in an effective measure, such that said rods physically interconnects at least one pair of side walls.

* * * * *